United States Patent

Nishimoto et al.

[11] Patent Number: 5,886,390
[45] Date of Patent: Mar. 23, 1999

[54] THERMOELECTRIC MATERIAL WITH DIFFUSION-PREVENTIVE LAYER

[75] Inventors: Seiji Nishimoto; Taku Kitayama; Yoshikazu Fujisawa, all of Saitama, Japan

[73] Assignee: Honda Giken Kogyo Kabushiki Kaisha, Tokyo, Japan

[21] Appl. No.: 893,322

[22] Filed: Jul. 16, 1997

[30] Foreign Application Priority Data

Jul. 16, 1996 [JP] Japan ................................ 8-185865

[51] Int. Cl.⁶ .................................................. H01L 31/058
[52] U.S. Cl. ........................ 257/467; 257/469; 257/751; 257/930; 136/203; 136/236.1; 136/239; 136/240
[58] Field of Search ..................................... 257/467, 469, 257/751, 930; 136/204, 203, 277, 239, 228, 236.1, 240

[56] References Cited

U.S. PATENT DOCUMENTS

| | | |
|---|---|---|
| 3,650,844 | 3/1972 | Kendall, Jr. et al. .................... 136/237 |
| 4,922,822 | 5/1990 | Bierschenk et al. ..................... 136/204 |
| 5,429,680 | 7/1995 | Fuschehi ................................. 136/203 |
| 5,436,467 | 7/1995 | Elsner et al. ............................. 257/15 |
| 5,550,387 | 8/1996 | Elsner et al. ............................. 257/15 |
| 5,665,176 | 9/1997 | Shinohara et al. ........................ 148/33 |
| 5,714,791 | 2/1998 | Chi et al. ................................ 257/467 |
| 5,747,728 | 5/1998 | Fleurial et al. .......................... 136/203 |

*Primary Examiner*—William Mintel
*Attorney, Agent, or Firm*—Lyon & Lyon LLP

[57] ABSTRACT

A thermoelectric material which exhibits a high thermoelectric performance even at high temperatures is shown and described. A thermoelectric material is provided with a plurality of conductive layers made of a first semiconductor only and a plurality of barrier layers made of a second semiconductor only, which are alternatingly arranged, a diffusion-preventive layer being interposed between neighboring conductive layers and barrier layers. Diffusion between the conductive layers and the barrier layers under high-temperature conditions is prevented, and the thermoelectric material maintains high performance standards at high temperatures.

3 Claims, 1 Drawing Sheet

THERMOELECTRIC MATERIAL WITH DIFFUSION-PREVENTIVE LAYER

FIELD OF THE INVENTION

The present invention relates to thermoelectric materials and, more particularly, to a thermoelectric material that performs well even at high temperatures.

BACKGROUND OF THE INVENTION

Currently available thermoelectric materials include a type in which conductive layers and barrier layers are layered adjacent to each other and are directly joined to each other (see, for example, U.S. Pat. No. 5,436,467).

In the thermoelectric material, the energy gap in the barrier layer is maintained to be much wider than the energy gap in the conductive layer to create a large difference between the two energy gaps, whereby quantum wells are formed in the conductive layers. As a result, the electric conductivity of the thermoelectric material is heightened, and an improved thermoelectric performance is exhibited.

However, when such a currently available thermoelectric material is subjected to a high temperature condition, the energy gap is broadened in the conductive layer and is narrowed in the barrier layer due to diffusion, mainly, mutual diffusion between the conductive layer and the barrier layer. Accordingly, the difference between the two energy gaps becomes small, making it impossible to form a quantum well in the conductive layer. As such, conventional thermoelectric materials have a low heat resistance and are incapable of maintaining adequate thermoelectric performance under a high temperature condition.

A need therefore exists for an improved thermoelectric material that maintains good performance at high temperatures. The present invention fulfills this need by preventing the occurrence of diffusion between the conductive layer and the barrier layer, and provides further related advantages.

SUMMARY OF THE INVENTION

Briefly, the present invention provides an improved thermoelectric material that maintains desirable performance characteristics at high temperatures. In a preferred embodiment of the present invention, a thermoelectric material is obtained by alternatingly arranging a plurality of conductive layers and a plurality of barrier layers, and interposing a diffusion-preventive layer between each of the conductive layers and the barrier layers to prevent diffusion between the conductive and barrier layers. The conductive layers are made of a first semiconductor only and the barrier layers are made of a second semiconductor only, the material of the second semiconductor being different from that of the first semiconductor.

In accordance with a preferred embodiment of the present invention, the diffusion-preventive layer prevents the occurrence of diffusion between the conductive layer and the barrier layer under a high-temperature condition. As a result, the thermoelectric material of the present invention exhibits an excellent heat resistance and a favorable thermoelectric performance, even at high temperatures.

DETAILED DESCRIPTION OF THE INVENTION

Figure 1:
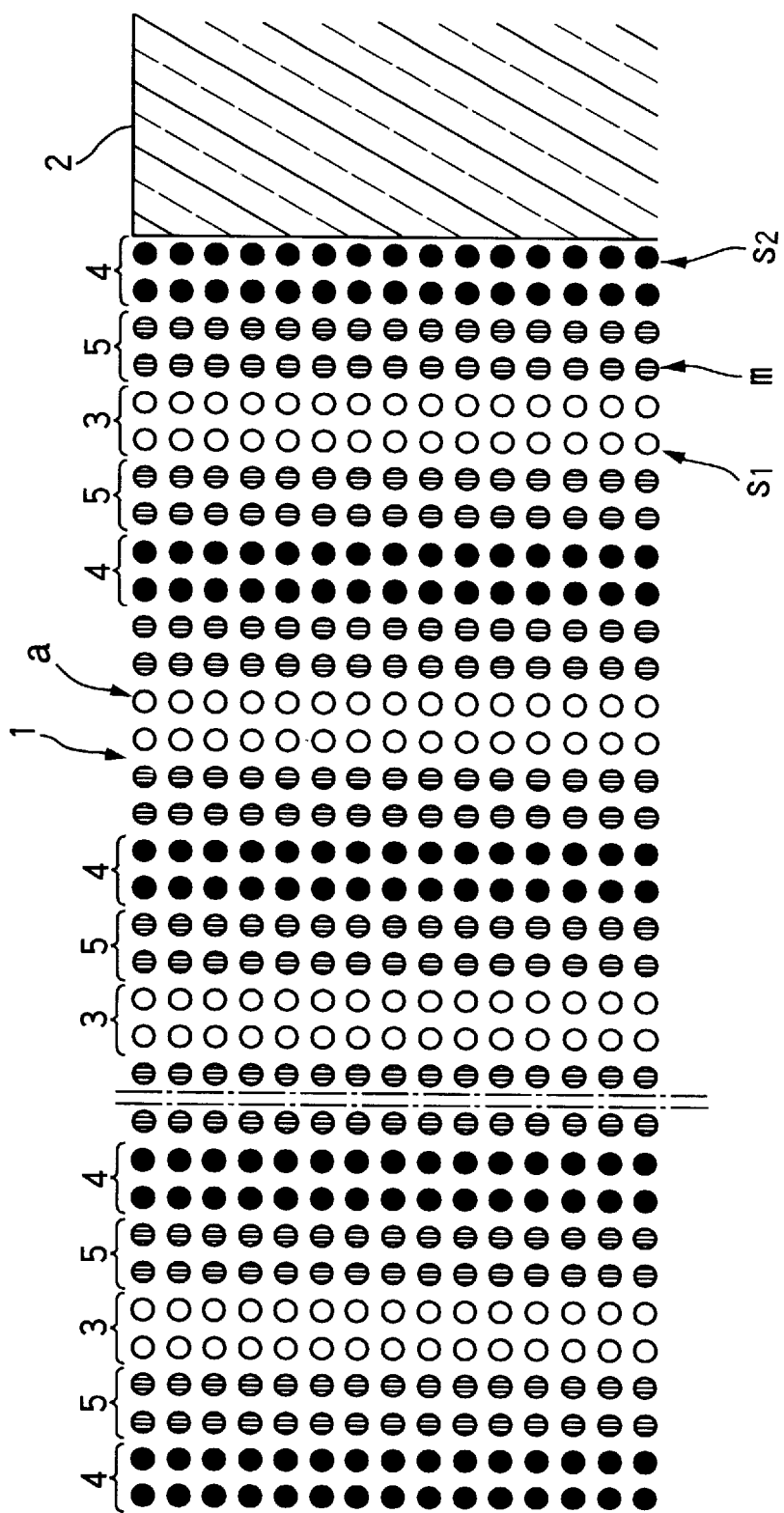
FIG. 1 is a diagram illustrating a thermoelectric material provided in accordance with a preferred embodiment of the present invention.

Referring to FIG. 1, a thermoelectric material 1 is formed in accordance with a preferred embodiment of the present invention on a substrate 2, and is constituted by a plurality of very thin, film-like conductive layers 3 made of a first semiconductor $s_1$ and a plurality of very thin, film-like barrier layers 4 made of a second semiconductor $s_1$. The material of the second semiconductor $s_2$ is different from the material of the first semiconductor $s_1$. The conductive layers 3 and barrier layers 4 are alternatingly arranged, with a very thin, film-like diffusion-preventive layer 5 being interposed between each adjacent conductive layer 3 and barrier layer 4, to prevent diffusion between the two layers 3 and 4. Although the layers may be provided in different orders, in the embodiment illustrated in FIG. 1, the barrier layers 4 are positioned on the substrate 2 and on the side of the material 1 most distal to the substrate 2.

As discussed in greater detail below, the thermoelectric material 1 provided in accordance with the present invention exhibits an excellent heat resistance and a favorable thermoelectric performance, even at high temperatures. It is believed that this is due to the diffusion-preventive layer 5 which prevents the occurrence of mutual diffusion between the conductive layer 3 and the barrier layer 4 under a high-temperature condition.

Although a variety of materials m may be used to form the diffusion-preventive layer 5, in a preferred embodiment, a material having a large Gibbs' free energy is used, i.e., a material which remains stable at high temperatures, is difficult to be decomposed and difficult to diffuse, yet exhibits semiconductor characteristics. Alternatively, a material having a large diffusion activation energy is used, i.e., a material having a small coefficient of diffusion, that is difficult to diffuse, yet exhibits semiconductor characteristics.

Examples of such materials m include, but are not limited to, metal oxides such as $SiO$, $SiO_2$, $TiO_2$, $FeO$, $Fe_2O_3$, $SnO_2$, $In_2O_3$ and $CaMnO_3$, silicates such as $SiC$ and the like, and borates such as $SiB$, $B_4C$ and the like. A single material or a mixture may be used. The diffusion-preventive layer 5 may therefore be formed by a plurality of constituent layers having different compositions.

Although the conductive layers 3 may be made of a variety of materials, examples of acceptable materials for the first semiconductor $s_1$ of which the conductive layer 3 is made, include p-type semiconductors such as $Fe_{0.9}Mn_{0.1}Si_2$ [$FeSi_2$ semiconductor], $(Si_{0.8}Ge_{0.2})B_{0.003}$ [SiGe semiconductor], $(PbTe_{0.95}Se_{0.05})$ $Na_{0.01}$ [PbTe semiconductor], and $(GeTe)_{0.85}$ $(AgSbTe_2)_{0.15}$ [PbTe substituted semiconductor], n-type semiconductors such as $Fe_{0.9}CO_{0.1}Si_2$ [$FeSi_2$ semiconductor], $(Si_{0.8}Ge_{0.2})P_{0.002}$ [SiGe semiconductor], $(Pb_{0.95}Ge_{0.05}Te)$ $(PbI_2)_{0.001}$ [PbTe semiconductor], and p-type and n-type BiTe semiconductors.

Although a variety of materials may be used for the second semiconductor $s_2$ of which the layers 4 are made, examples of acceptable materials include $Si$, $FeSi_2$ [$FeSi_2$ semiconductor], $Si_{0.8}Ge_{0.2}$ [SiGe semiconductor] and $(Pb_{0.9}Eu_{0.07})Te$ [PbTe semiconductor].

The thermoelectric material 1 is produced by sputtering which is a generally employed thin film-forming method. In one embodiment, the substrate is a glass for semiconductor substrate, silicon wafer, ceramic wafer or a high molecular film. The inside of the chamber used to produce the material is evacuated to about $10^-$Torr and is substituted with argon gas. After the flow rate of argon gas is adjusted, the electric discharge is started. During the discharge, the flow rate of argon gas is set at 5 to 25 SCCM (SCCM: mass flow rate), the electric power for sputtering is set at 50 to 500 watts, and the sputtering rate is set at 10 to 300 Å/second.

The layers are successively formed; for example, a barrier layer 4, diffusion-preventive layer 5, conductive layer 3 and diffusion-preventive layer 5, are formed on the substrate 2, making one cycle. The formation is repeated a required number of cycles and, lastly, the barrier layer 4 is formed to serve as the outermost layer.

An Example will now be described.

Table 1 shows the manufacturing conditions of the thermoelectric material 1, under which a plurality of Examples were produced.

one side was heated at 300° C. by using an infrared ray heater, the temperature of the electrode of the other side was held at room temperature to create a temperature gradient, and the thermoelectric power generated across the two electrodes was measured. The temperatures of the two electrodes were controlled by using thermocouples. The electric conductivity was measured based on the known four-terminal method.

Next, the Examples and the Comparative Examples were tested for their heat resistances by changing the heating temperature over a range of from 100° C. to 800° C., and maintaining them at each of the temperatures for 20 hours (constant). Thereafter, the thermoelectric outputs and the electric conductivities were measured in the same manner as described above.

Table 2 shows the results of the measurement together with the values measured under the non-heated condition.

TABLE 2

| | Diffusion-preventive layer | Thermoelectric material Properties | not heated | 100 | 200 | 500 | 800 |
|---|---|---|---|---|---|---|---|
| Example | yes | Thermoelectric output(W) | 8 | 7.8 | 8.3 | 8.1 | 7.5 |
| | | Electric Conductivity σ (S/m) | 38000 | 39000 | 37000 | 40000 | 35000 |
| Comparative Example | no | Thermoelectric Output(W) | 8.1 | 8.3 | 5.7 | 1.3 | 0.5 |
| | | Electric conductivity σ (S/m) | 40000 | 38000 | 29000 | 11000 | 5500 |

Heating temperature (°C.) spans columns: 100, 200, 500, 800.

TABLE 1

| Substrate | Glass for semiconductor substrate, Substrate temp.: room temp. |
|---|---|
| Conditions inside the chamber | Pressure: 5 × 10⁻³ Torr, argon gas atmosphere |
| Discharging conditions | argon gas flow rate: 15 SCCM, sputtering power: 100 watts, sputtering rate: 10 Å/sec. |

| | Material | Thickness |
|---|---|---|
| Barrier layer | Si | 50 Å |
| Diffusion-preventive layer | SiO$_2$ | 50 Å |
| Conductive layer | (Si$_{0.8}$Ge$_{0.2}$)B$_{0.003}$ | 50 Å |
| Number of cycles | 100 times (after repeated 100 cycles, the barrier layer which is the outermost layer is formed) | |

For comparison, a plurality of Comparative Examples were produced under the same manufacturing conditions as those of Table 1 except that the barrier layer 4 and the subsequent conductive layer 3 were formed in a cycle without forming the diffusion-preventive layer 5.

After the production, the thermoelectric outputs and electric conductivities of the Examples and the Comparative Examples, without being heated, were measured by the methods described below.

Electrodes were attached to both film-forming surfaces a (the drawing shows only one film-forming surface a) of the Examples and Comparative Examples. The electrode of the In the case of the Examples in Table 2, the thermoelectric output and the electric conductivity after the heat resistance test vary to some extent with a change in the heating temperature; however, the variation lies within a range of deviation from the reference value of under the non-heated condition. It can therefore be said that the Examples exhibit excellent heat resistance irrespective of a change in the temperature. This stems from the fact that the mutual diffusion between the barrier layer 4 and the conductive layer 3 is prevented by the diffusion-preventive layer 5 under the heated condition.

The Comparative Examples exhibit thermoelectric performances similar to those of the Examples under the non-heated condition, but the thermoelectric outputs and the electric conductivities of the Comparative Examples decrease with an increase in the heating temperature. This stems from the fact that mutual diffusion took place between the barrier layer and the conductive layer under the heated condition.

Next, the Examples and the Comparative Examples were heated at 500° C. (constant), tested for their heat resistances by changing the holding time but maintaining this temperature, and were then measured for their thermoelectric outputs and electric conductivities in the same manner as described above.

Table 3 shows the results of the measurement together with the values measured under the non-heated condition.

TABLE 3

|  | Diffusion-preventive layer | Thermoelectric material Properties | Holding time (hrs) | | | | |
| --- | --- | --- | --- | --- | --- | --- | --- |
|  |  |  | not heated | 1 | 10 | 100 | 1000 |
| Example | yes | Thermoelectric output(W) | 8 | 7.8 | 8.3 | 7.8 | 7.5 |
|  |  | Electric Conductivity σ (S/m) | 38000 | 39000 | 37000 | 40000 | 35000 |
| Comparative Example | no | Thermoelectric output(W) | 8.1 | 5.1 | 1.5 | 0.7 | 0.6 |
|  |  | electric conductivity σ (S/m) | 40000 | 27000 | 15000 | 8000 | 7000 |

In the case of the Examples in Table 3, the thermoelectric outputs and the electric conductivities after the heat resistance test vary to some extent with a change in the holding time; however, the variation lies within a range of deviation from the reference value of under the non-heated condition. It can therefore be said that the Examples exhibit excellent heat resistance irrespective of a change in the holding time. This stems from the fact that the mutual diffusion between the barrier layer 4 and the conductive layer 3 is prevented by the diffusion-preventive layer 5 under the heated condition in the same manner as described above.

In the case of the Comparative Examples, the thermoelectric outputs and the electric conductivities decrease with an increase in the holding time. This stems from the fact that mutual diffusion took place between the barrier layer and the conductive layer under the heated condition in the same manner as described above.

A thermoelectric material which exhibits an excellent heat resistance and favorable thermoelectric performance under high-temperature conditions has been shown and described. From the foregoing, it will be appreciated that although embodiments of the invention have been described herein for purposes of illustration, various modifications may be made without deviating from the spirit of the invention. Thus, the present invention is not limited to the embodiments described herein, but rather is defined by the claims which follow.

We claim:

1. A thermoelectric material comprising:
    a plurality of conductive layers alternatingly arranged with a plurality of barrier layers, a diffusion-preventive layer being provided between each adjacent conductive layer and barrier layer to prevent diffusion between each of the conductive layers and the adjacent barrier layers.

2. The thermoelectric material according to claim 1 wherein the conductive layers are made of a first semiconductor only and the barrier layers are made of a second semiconductor only, a material of the second semiconductor being different from a material of the first semiconductor.

3. The thermoelectric material according to claim 2 wherein the first semiconductor is selected from the group consisting of $FeSi_2$ semiconductor, SiGe semiconductor, PbTe semiconductor and BiTe semiconductor, the second semiconductor is selected from the group consisting of Si, $FeSi_2$ semiconductor, SiGe semiconductor and PbTe semiconductor, and the diffusion-preventive layer is made of a material selected from the group consisting of SiO, $SiO_2$, $TiO_2$, FeO, $Fe_2O_3$, $SnO_2$, $In_2O_3$, $CaMnO_3$, SiC, SiB and $B_4C$.

* * * * *

UNITED STATES PATENT AND TRADEMARK OFFICE
CERTIFICATE OF CORRECTION

PATENT NO  :  5,886,390
DATED      :  March 23, 1999
INVENTOR(S) :  Seiji Nishimoto et al.

It is certified that error appears in the above-identified patent and that said Letters Patent are hereby corrected as shown below:

Column 2, line    please change "$S_1$" to -- $S_2$ --.

Column 2, line 62, please change "$10^-$" to -- $10^{-3}$ --.

Signed and Sealed this

Fourteenth Day of March, 2000

Attest:

Attesting Officer

Q. TODD DICKINSON

Commissioner of Patents and Trademarks